US012802113B2

(12) United States Patent
Dove

(10) Patent No.: US 12,802,113 B2
(45) Date of Patent: Nov. 17, 2026

(54) AUTOMATED MARKETPLACE MONITORING AND ALERT SYSTEM

(71) Applicant: John Dove, Fort Worth, TX (US)

(72) Inventor: John Dove, Fort Worth, TX (US)

( * ) Notice: Subject to any disclaimer, the term of this patent is extended or adjusted under 35 U.S.C. 154(b) by 0 days.

(21) Appl. No.: 19/234,578

(22) Filed: Jun. 11, 2025

(65) Prior Publication Data

US 2026/0057427 A1 Feb. 26, 2026

Related U.S. Application Data

(60) Provisional application No. 63/685,292, filed on Aug. 21, 2024.

(51) Int. Cl.
*G06Q 30/0601* (2023.01)
*G06F 30/27* (2020.01)

(52) U.S. Cl.
CPC ......... *G06Q 30/0627* (2013.01); *G06F 30/27* (2020.01)

(58) Field of Classification Search
CPC ............................ G06Q 30/0627; G06F 30/27
See application file for complete search history.

(56) References Cited

U.S. PATENT DOCUMENTS

| | | | | |
|---|---|---|---|---|
| 9,972,038 | B2 * | 5/2018 | Godsey | G06Q 30/0641 |
| 10,055,786 | B2 * | 8/2018 | Shusterman | G06Q 30/08 |
| 10,692,134 | B2 * | 6/2020 | Shusterman | G06Q 30/08 |
| 11,204,971 | B1 * | 12/2021 | Vilcinskas | H04L 67/02 |
| 11,205,188 | B1 * | 12/2021 | Engle | G06Q 30/0225 |
| 11,416,291 | B1 * | 8/2022 | Vilcinskas | H04L 63/0281 |
| 12,020,470 | B1 * | 6/2024 | Saraee | G06F 16/438 |
| 2007/0067297 | A1 * | 3/2007 | Kublickis | G06Q 30/02<br>707/999.009 |
| 2010/0121843 | A1 * | 5/2010 | Goeldi | G06Q 10/00<br>707/E17.071 |
| 2012/0011029 | A1 * | 1/2012 | Thomas | G06Q 30/0643<br>705/26.63 |
| 2012/0011030 | A1 * | 1/2012 | Thomas | G06Q 30/06<br>705/26.63 |
| 2012/0016771 | A1 * | 1/2012 | Thomas | G06Q 30/0641<br>705/26.63 |
| 2014/0019204 | A1 * | 1/2014 | Briere | G06F 16/2379<br>705/7.29 |
| 2014/0195448 | A1 * | 7/2014 | Scarbrough | G06Q 10/40<br>705/342 |

(Continued)

*Primary Examiner* — Oluseye Iwarere

(57) ABSTRACT

A system is provided that alerts users to newly surfaced third-party digital listings matching predefined criteria, wherein said criteria are executed continuously or on-demand through distributed compute nodes. The system receives input for searching at least one online marketplace, the input received from a user device and providing description of a desired item of merchandise and criteria associated with the item. The system also launches web scraping of select online marketplaces in search of the item and continuously monitors the select online marketplaces using Python-based headless scrapers. The system also parses and normalizes data gathered during the web scraping with listings processed as they appear in near real time, identifies items of the data matching the received input, and formats and pushes alerts to the user device describing the identified items. The criteria initially comprise keywords, minimum and maximum prices, and selected online marketplaces to be searched.

8 Claims, 3 Drawing Sheets

(56) References Cited

U.S. PATENT DOCUMENTS

| | | | | |
|---|---|---|---|---|
| 2015/0112836 | A1* | 4/2015 | Godsey | G06Q 30/0641 705/26.41 |
| 2015/0134372 | A1* | 5/2015 | Lopez Ruiz | G06Q 10/02 705/5 |
| 2016/0042425 | A1* | 2/2016 | Mukherjee | G06Q 30/0619 705/26.62 |
| 2016/0063611 | A1* | 3/2016 | Davis | G06F 16/532 705/26.63 |
| 2017/0109767 | A1* | 4/2017 | Shpanya | G06Q 30/0283 |
| 2018/0322568 | A1* | 11/2018 | Shusterman | G06Q 30/08 |
| 2019/0066175 | A1* | 2/2019 | Godsey | G06Q 30/0625 |
| 2019/0311422 | A1* | 10/2019 | Davis | G06Q 30/0639 |
| 2020/0327110 | A1* | 10/2020 | Grazziotin | G06F 16/2272 |
| 2021/0312474 | A1* | 10/2021 | Yu | G06F 16/958 |
| 2021/0358003 | A1* | 11/2021 | Godsey | G06Q 30/0641 |
| 2024/0054534 | A1* | 2/2024 | Amos | G06Q 30/0205 |
| 2024/0212315 | A1* | 6/2024 | Saraee | G06F 16/438 |
| 2026/0057427 | A1* | 2/2026 | Dove | G06Q 30/0627 |

* cited by examiner

| Aspect | Push-Based System | Pull-Based System |
|---|---|---|
| Trigger Mechanism | Background loop | User action |
| User Interaction | Passive (saved search + alert) | Active (search bar input) |
| Timing | Continuous | On-demand |
| Data Freshness | Near-real-time (minutes old) | Real-time (fetched immediately) |
| Architecture Style | Event-driven notification engine | Federated metasearch engine |

FIG. 2

| Functional Layer | Current Tool(s) | Alternate Tools / Substitutes |
|---|---|---|
| Headless HTTP Fetch | aiohttp, httpx, cloudscraper | Selenium (headless), Puppeteer, Playwright, Scrapy |
| Queue & Tasks | Celery + Redis | RQ, Dramatiq, RabbitMQ, Kafka, Airflow |
| Alert Delivery | Email, push notification | SMS, webhook, Discord/Slack bots, in-app banners |
| Deduplication | Redis key tracking | Bloom filters, hash maps, Postgres, MongoDB |
| Inflight Task Mgmt | Redis, Python locks | etcd, Zookeeper, shared memory semaphores |
| Proxies & Anti-bot | Custom proxy manager | Rotating IP pools, VPNs, Tor, commercial proxy APIs |
| Search Engine Model | Federated live query (DealHunter) | API Gateway Aggregator, GraphQL live resolvers |

FIG. 3

AUTOMATED MARKETPLACE MONITORING AND ALERT SYSTEM

CROSS REFERENCE TO RELATED APPLICATIONS

The present non-provisional patent application is related to U.S. Provisional Patent Application No. 63/685,292 filed Aug. 21, 2024, the contents of which are incorporated herein in their entirety.

FIELD OF THE DISCLOSURE

The present disclosure is in the field of online shopping. More particularly, systems and methods described herein receive user requirements for shopping for a specific item, search numerous online marketplaces simultaneously, and notify the user without delay when a listing is found matching the requirements

BACKGROUND

Online marketplaces have revolutionized the way consumers buy and sell goods, offering a diverse range of products to meet virtually any need. Such virtual marketplaces have become a primary destination for consumers seeking to purchase new and used goods. However, with the abundance of listings and the dynamic nature of these platforms, it can be challenging for users to find specific items that meet all their requirements.

The sheer volume of listings and the speed at which popular items are sold often result in missed opportunities for buyers. For individuals seeking specific products, especially those that are rare, high-demand, or time-sensitive, the traditional approach of manually searching and browsing these marketplaces is inefficient and often ineffective.

Platforms such as eBay, Craigslist, Facebook Marketplace, Mercari, Poshmark, OfferUp, and 5Miles offer a vast array of products, but the sheer volume of listings can make it difficult for users to find specific items that meet their criteria without constantly searching. Every platform offers different listings, and deals disappear within seconds. Users must constantly refresh tabs, set up search filters, and manually compare listings across apps. Traditionally, buyers have had to manually search these platforms at regular intervals, often missing out on desirable items that are quickly taken by others.

SUMMARY

Systems and methods described herein provide an advanced automated system designed to monitor and search various online marketplaces for products that meet specific user-defined criteria. The need for manual searching may be eliminated, providing users with real-time alerts when items matching their desired specifications are listed on popular platforms. By leveraging the power of continuous, automated searching, the system may enable users to act quickly and secure desired items before other users even become aware of the items'availability.

Systems and methods provided herein, which may collectively be referred to hereinafter by its commercial name of DealHunter, provide an automated solution that continuously monitors these marketplaces, searching for items that match user-defined criteria such as keywords, price range, and market preference. By parsing fresh data in real-time, the system can alert users as soon as matching items are listed, giving them a significant advantage in securing the items they want. This not only saves time but also enhances the efficiency of online shopping, making it easier for users to find and purchase desired items quickly and conveniently.

Two basic structures are provided herein to accomplish the objectives described. For discussion purposes a first structure provided is referred to herein as Real-Time Monitoring Alerts. A second structure is referred to herein as Federated Live Search.

The Real-Time Monitoring Alerts system runs searches on selected online marketplaces, parsing through listings to identify those that meet all the specified criteria. When a matching item is found, the system immediately sends an alert to the user via messaging platforms such as Telegram. The user may quickly execute a transaction to purchase the item of interest.

System architecture is provided to perform high-frequency, automated searches across multiple online marketplaces. The system operates on remote servers, where it launches search functionality that simulates the actions a user would take to search for items on these platforms. By mimicking user behavior, the system navigates through marketplace websites, input search criteria, and retrieve relevant listings.

The retrieved data is parsed to extract relevant information such as the title, price, location, and other key attributes of each listing. The system compares this data against the user's predefined criteria to determine if the listing is a match. If a match is found, the system triggers an alert, notifying the user almost instantly. This rapid response is crucial in helping users secure items before they are purchased by others.

Scalability and reliability are principal features of the present disclosure. The system can handle many users simultaneously, performing searches across multiple marketplaces without compromising speed or accuracy. The monitoring and alert system is supported by a backend infrastructure that includes memory management, CPU load balancing, and real-time performance monitoring. These components support the system remaining responsive and efficient, even during peak usage times.

The system's architecture is modular, allowing for integration of new online marketplaces as they emerge. This flexibility may promote the service expanding and adapting to the changing landscape of online shopping and may promote users to remain at the forefront of new opportunities.

User experience is a prominent focus of this invention. Setting up a search is intuitive and straightforward, requiring users to input their search terms, select marketplaces, and define price ranges. The system works continuously in the background to find matching items. Users receive alerts through a convenient messaging platform, allowing them to act quickly without needing to check their searches manually.

The system is designed to respect user preferences and privacy. It does not store or cache data from searches such that searches are conducted using fresh, up-to-date information. This approach supports accuracy of search results and may align with accepted practices for data security and privacy.

Federated Live Search allows users to perform on-demand live searches* across all integrated marketplaces. Users receive real-time aggregated results, directly fetched from sources. Users leverage the same marketplace scraping logic and proxy intelligence used for alerting, but bypass cache layers to ensure the latest data.

Key attributes of Federated Live Search include latency trade-off. Unlike alerting which benefits from cache, this mode prioritizes data freshness and may incur longer load times. Another key attribute is comparison model. Similar to services like Zillow for real estate or Point.me for flight rewards—results reflect what is available at query time.

Federated Live Search also features Unified entrypoint that is accessible from DealHunter.io's frontend and API, enabling both manual search and programmatic integration. Federated Live Search is integrated with proxy and rate-limiting safeguards to avoid triggering bans from source marketplaces. Federated Live Search transforms DealHunter from a passive alert engine into an active search platform, giving users both monitoring and search capabilities in one system.

DealHunter may be primarily directed to consumer shopping, where advantages are afforded to parties seeking to purchase specific items from online marketplaces. Applications extend beyond individual consumers wherein businesses and resellers may use the system to identify profitable opportunities, such as underpriced items or bulk purchases, that can be resold at a higher value. Additionally, collectors searching for rare or unique items can benefit from the system's ability to identify listings as soon as they become available.

The present disclosure was developed with careful consideration of legal and ethical guidelines, particularly concerning web scraping and data retrieval from online marketplaces. The system operates within the bounds of legality, ensuring that all searches are conducted in a manner that respects the terms of service of the platforms being searched. It avoids storing or caching data, thereby minimizing potential legal risks associated with data retention and privacy violations.

In addition to legal compliance, the present disclosure also emphasizes ethical usage. Users are encouraged to use the system responsibly, and the service includes safeguards to prevent abuse, such as limiting the frequency of searches or the number of simultaneous searches a single user can perform. These measures help to ensure that the system is used for its intended purpose of enhancing the shopping experience, rather than for activities that could harm other users or disrupt the marketplace ecosystem.

Systems and methods provided herein may represent significant advancements in the way users interact with online marketplaces. By automating the search process and providing real-time alerts, systems address a common pain point for consumers and businesses alike, offering a solution that is both efficient and user-friendly.

BRIEF DESCRIPTION OF THE FIGURES

FIG. 2 is a table illustrating differences between push and pull methods of delivering alerts to users.

FIG. 3 is a table listing alternate tools and technical substitutions with example substitutions across system layers.

DETAILED DESCRIPTION

Figure 1:
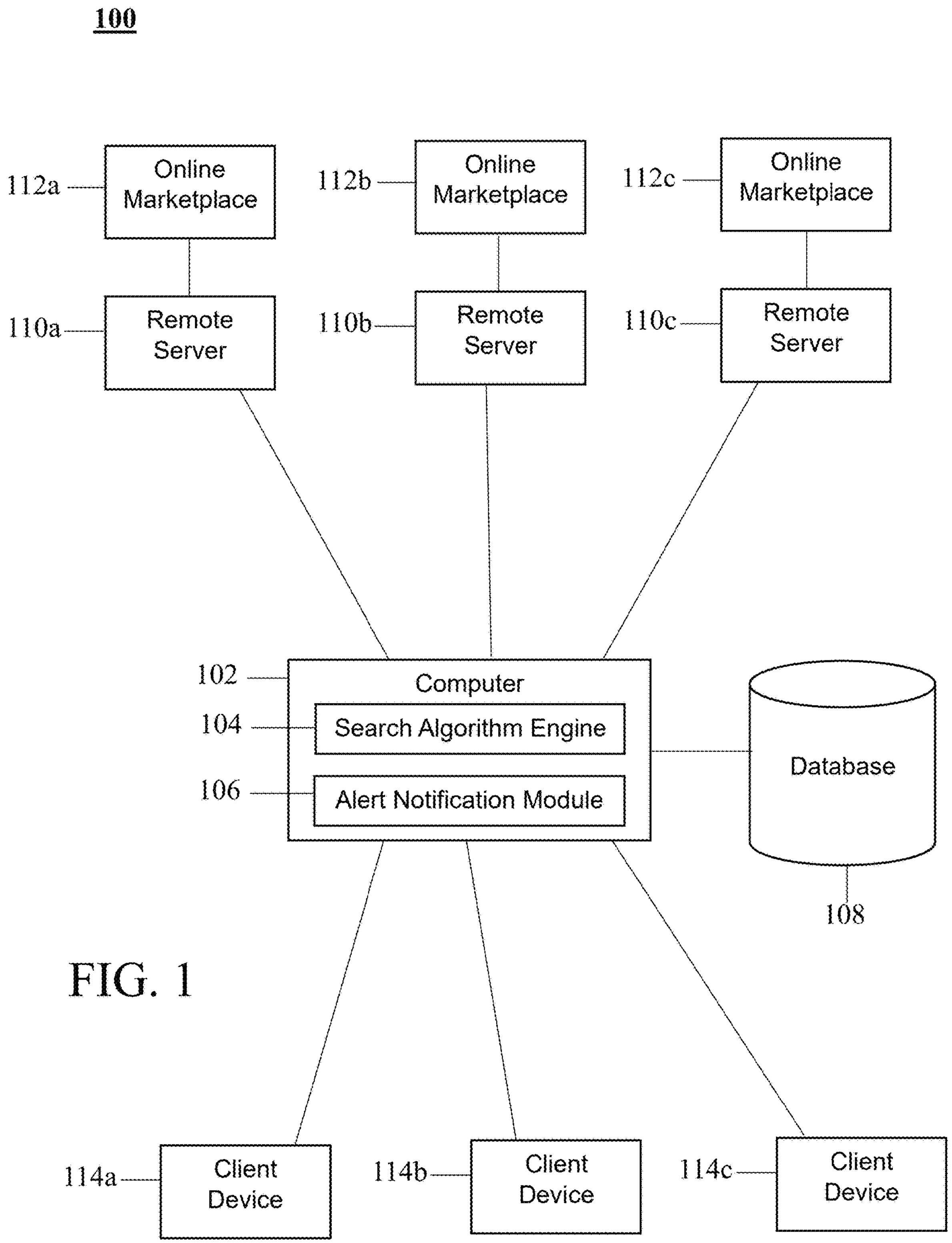
FIG. 1 is a block diagram of an automated marketplace monitoring and alert system according to an embodiment of the present disclosure.

The present disclosure provides a comprehensive, automated search and alert system designed to monitor multiple online marketplaces in real-time, providing users with instant notifications when items matching their search criteria become available. This system addresses the growing need for efficiency and speed in finding and purchasing products, particularly in a digital landscape where new listings can appear and disappear rapidly. The system operates by utilizing a network of remote servers to continuously scan selected marketplaces, parse relevant data, and trigger alerts when user-defined conditions are met.

With Real-Time Monitoring and Alerts, the platform continuously monitors select online marketplaces using Python-based headless scrapers. Listings are processed as they appear in near real time. When a match is found for a user's saved search, the system immediately formats and pushes an alert to the user via app, email, or other method. Listings are not fully cached or indexed.

The Real-Time Monitoring and Alerts structure provides that only lightweight metadata such as listing IDs and alert status are stored to prevent duplicate notifications. Under normal operation, users are alerted within minutes of a listing going live. This push-based system is optimized for background scanning and fast user notification. In unusual cases, older listings may occasionally surface if the marketplace delays publishing or hides listings temporarily.

The Federated Live Search functionality provides a real-time query interface, typically a search bar, that the user actively engages with. When a query is submitted, the system broadcasts real-time fetches to each selected marketplace. It does not use pre-crawled or cached data. Instead, each invocation retrieves fresh, up-to-the-second results from the live sources.

Federated Live Search performs a real-time query across all marketplaces. Unlike cached systems, this fetches live data from each site at the moment of the query Federated Live Search is architecturally and operationally distinct from traditional search engines such as Google, which index and cache results in advance. Instead, Federated Live Search functions more like a federated search engine, for example Kayak or MetaCrawler, where queries are dispatched live across multiple third-party sources and responses are aggregated.

The Federated Live Search structure may be computationally and financially more expensive than serving from cache. User queries may result in multiple live HTTP/API calls, real-time proxy usage, and dynamic parsing, each of which may occur on-demand—no batching, indexing, or storage is leveraged.

The Real-Time Monitoring Alerts system is built on a modular architecture, ensuring flexibility, scalability, and reliability. At its core, Real-Time Monitoring Alerts comprises several key components: web scrapers, data parsers, a centralized database, a search algorithm engine, and an alert notification system. The web scrapers are deployed across remote servers, each configured to access specific marketplaces. These scrapers mimic human browsing behavior, entering search terms, navigating pages, and extracting data related to item listings.

Data collected by the web scrapers is processed by the data parsers. The parsers clean and normalize the data, converting diverse information formats from various marketplaces into a standardized structure. This step supports the search algorithm engine in accurately and efficiently processing the data. The search algorithm engine applies user-defined filters, such as keywords, price ranges, and preferred marketplaces, to sift through the large amounts of data gathered and identify items that match the specified criteria.

The web scraping component of the Real-Time Monitoring Alerts is designed with an emphasis on legal and ethical compliance. Each marketplace has its own terms of service and restrictions on automated data collection, and the system is engineered to respect these boundaries. This includes the use of rate limiting, user-agent rotation, and IP proxying to avoid overloading marketplace servers and to maintain anonymity. Real-Time Monitoring Alerts also incorporates mechanisms to handle CAPTCHA challenges and other anti-bot measures without violating legal restrictions.

An important feature of Real-Time Monitoring Alerts is its real-time search and alert capability. Users can define specific search parameters, such as item keywords, minimum and maximum prices, and the marketplaces to be monitored. The system runs these searches continuously, ensuring that users are among the first to be notified when a matching item is listed.

Alerts are sent instantly via preferred communication channels, such as Telegram, email, or potentially other messaging platforms like WhatsApp and mobile push notifications. This real-time functionality provides users with a significant advantage in securing desirable items before they are purchased by others.

Real-Time Monitoring Alerts is scalable and may handle thousands of simultaneous users and millions of searches across various marketplaces. Scalability is achieved through a combination of vertical and horizontal scaling strategies, with the use of cloud-based services and containerization technologies such as Docker and Kubernetes.

Performance optimization is an ongoing process, with tools in place to monitor system performance in real-time, identifying and addressing bottlenecks in CPU, memory, and network usage. Load balancing and failover mechanisms are implemented to ensure high availability and reliability, even under heavy load conditions.

The user interface of Real-Time Monitoring Alerts is intuitive and user-friendly, allowing users to configure and manage their searches. The interface provides options for setting search parameters, choosing marketplaces, and selecting alert preferences. A dashboard offers users an overview of their active searches and recent alerts, with the ability to adjust settings as needed. The design prioritizes ease of use, ensuring that even users with minimal technical knowledge can effectively use the system.

Federated Live Search provides real-time alerts, cross-market live search, and smart filters including price, keywords, exclusions, region, and seller. Federated Live Search also provides cache-bypassed fresh search, custom proxy infrastructure to avoid bans and delays, and dashboard for scraped listings and success and failure rates.

Both Real-Time Monitoring Alerts and Federated Live Search may have broad applications across various user groups, including consumers, businesses, and collectors. For consumers, the system offers a convenient way to find deals on products without the need for constant manual searching.

Businesses can use the system to monitor competitors or identify resale opportunities in real-time. Collectors, particularly those searching for rare or niche items, will find the system invaluable in tracking down hard-to-find products across multiple marketplaces.

A user may create a saved search such as: "Electric Bike, under $500, exclude 'broken', in Austin." DealHunter watches all supported marketplaces continuously and alerts the user instantly when something matches. DealHunter optionally runs that same search on-demand, aggregating the latest listings in seconds. The user may click through directly to the listing, compare prices, and act before any other party even sees the listing.

DealHunter provides significant advantages for users including first-mover advantage. In an environment in which many listings are sold or deleted within minutes, DealHunter's speed gets the user there first. For simplicity, instead of checking six online marketplaces, DealHunter becomes the user's one-stop search engine.

For customization, the user may tailor searches with advanced options such as keyword exclusions or geo-fencing. For trust and transparency, each scraped result is shown with metadata: scrape timestamp, listing freshness, and proxy source.

DealHunter operates at scale with distributed task processing, robust caching, fault-tolerant search retries, and proxy-based anti-bot mitigation. Unlike traditional scraping tools or alert services, DealHunter features a modular, scalable architecture using containerized workers managed by Kubernetes and Helm. It also features real-time deduplication and inflight task tracking with Redis.

DealHunter further provides a Redis-to-MongoDB syncing mechanism that ensures fast search results without overloading the primary database. It also features smart proxy rotation with failover and health checks to bypass marketplace anti-bot systems.

Dedicated maintenance workers are responsible for ingesting fresh marketplace data and syncing it to the cache for use by stateless processing workers. DealHunter also provides flexible messaging integration and real-time feedback for users through external services and potentially mobile apps.

DealHunter features decoupled market-specific caches: Each marketplace has its own Redis cache (dedicated DB), allowing isolated task management and avoiding cross-market contention. DealHunter also provides inflight tracking via Redis: Redundant task submission across a distributed cluster is prevented by marking in-progress tasks with TTL-bound Redis keys.

DealHunter further features leader-elected maintenance workers. Only certain worker types connect to MongoDB for persistence; others use ephemeral Redis-backed state, increasing system resilience and throughput.

Smart retry logic with proxy failover allows workers to use enhanced retry decorators that incorporate rotating proxies, exponential backoff, and IP-level failover strategies. Under DealHunter's cluster-wide health checks and init flags, startup readiness gates ensure each marketplace signals initialization before search jobs are dispatched. Under DealHunter's non-blocking cache updates, Redis pub/sub updates are published for live memory refresh while ensuring async safety across worker threads.

Tools and components used in DealHunter are described below. No GPL-licensed components or license-restrictive frameworks are used in core functionality.

Infrastructure and Deployment

Kubernetes (Apache 2.0): Orchestrates containerized Celery workers across the cluster.

Helm (Apache 2.0): Package manager for Kubernetes—templates Celery deployments, Redis services.

Terraform (MPL 2.0): Infrastructure as Code, used to provision Talos-based K8s nodes and Redis clusters.

Backend Task System

Celery (BSD): Used for distributed task processing across worker pools.

Redis (BSD): Employed for task queue brokering, inflight tracking, per-marketplace caches, and pub/sub synchronization.

Datastore Layer

MongoDB with Motor (Apache 2.0): Used for persistent storage of search definitions, deduplicated results, and historical item data. Only accessed by maintenance workers to reduce connection overhead.

Code-Level Architecture

Python 3.11+: Fully asynchronous, coroutine-safe architecture with 'asyncio', 'httpx', and 'aiohttp'.

Redis-based inflight deduplication: Uses TTL-backed inflight markers to prevent redundant processing.

Custom ProxyManager: Tracks proxy health, supports round-robin and failover logic, and uses Redis for distributed leader election.

Healthcheck and Diagnostic Scripts: Includes readiness probes for Kubernetes and diagnostics for Celery worker state and Redis responsiveness.

Observability and Debugging debugpy: Enabled via Kubernetes LoadBalancer for persistent VS Code remote debugging across all worker types.

Custom logging with Loguru: Unified structured logging with adjustable verbosity and formatting.

Legal and Ethical Considerations

All scraping logic adheres to responsible scraping practices including:

Respect for rate limits and adaptive throttling.

Use of rotating user-agents and proxies to mimic natural user behavior.

Avoidance of content caching or long-term data storage unless explicitly permitted.

System safeguards against high-frequency polling or abuse by end-users.

Licensing Compatibility Notes

No components licensed under the GNU GPL, AGPL, or other copyleft licenses incompatible with commercial software or patent claims are used. All dependencies are licensed under permissive terms:

Celery, Redis, MongoDB/Motor, httpx, aiohttp: All under BSD, Apache 2.0, or MIT licenses.

Kubernetes, Helm, Terraform: Apache 2.0.

ProxyManager, CircuitBreaker, and Caching Logic: All original code under MIT-compatible logic authored by the applicant.

Given the nature of the system, user privacy and data security are paramount. The invention employs robust encryption methods to protect user data, both in transit and at rest. User credentials are securely stored, and sensitive information is never shared with third parties.

The system also includes features for managing user data preferences, allowing users to control how their information is used and stored. Regular security audits and updates ensure that the system remains secure against emerging threats.

While the current version of the system offers powerful search and alert capabilities further features may include integration of machine learning algorithms to improve search accuracy and predictive analytics to suggest potential searches based on user behavior. Expansion to additional online marketplaces and development of mobile applications may also be included, further extending the system's reach and utility.

Turing to the figures, FIG. 1 is a block diagram of an automated marketplace monitoring and alert system according to an embodiment of the present disclosure. FIG. 1 depicts components of a system 100 comprising a computer 102, a search algorithm engine 104, and an alert notification module 106. System 100 also comprises a database 108, remote servers 110*a-c*, and online marketplaces 112*a-c*, and client devices 114*a-c*.

The computer 102 may be more than one physical computing device situated at more than one physical location. The computer 102 also comprises networking and other hardware and software to facilitate communications between components executing on the computer 102 and components executing elsewhere on other devices.

The search algorithm engine 104 executes at least partially on the computer 102 and directs the remote servers 110*a-c* to search specific online marketplaces 112*a-c*. The search algorithm engine 104 acts at least partially based on instructions entered by users on their client devices 114*a-c*. The alert notification module 106 executes at least partially on the computer 102 and sends alerts to client devices 114*a-c* when preferences entered into the client devices 114*a-c* are found.

Systems and methods provided herein use at least two methods for providing alerts to users of client devices 114*a-c*. For Real-Time Monitoring Alerts, push-based monitoring is used in which listings are discovered via continuous background polling of third-party sources.

In an embodiment, the remote servers 110*a-c* and the online marketplaces 112*a-c* do not align in a one to one manner as depicted in FIG. 1. In an embodiment, a single remote server 110*a* may align with more than one or all online marketplaces 112*a-c*.

If a listing matches user-defined rules (e.g. keywords, price range), an automated alert is immediately dispatched to the user (email, push, etc.). This is a push model because users passively receive alerts when a match is found. Listings from one or more external sources are polled continuously and matches to stored user criteria are pushed to the user without query invocation.

For Federated Live Search with its feature of On-Demand Query, pull-based monitoring is used. Users actively enter a search (e.g. via a search bar). The system immediately queries all selected marketplaces in real time (no cached data). Results are aggregated live and returned to the user, mimicking federated or metasearch behavior. A user-submitted query triggers real-time fetches to external marketplaces, with no reliance on pre-indexed data. FIG. 2 is a table illustrating differences between push and pull methods discussed above.

FIG. 3 is a table illustrating alternate tools and technical substitutions with example substitutions across system layers.

Systems and methods provided herein are not a traditional search engine architecture such as that provided by Google. A central index is not involved here. The real-time query model provided herein is architecturally and operationally distinct from previous implementations. Unlike traditional search engines that rely on centralized indexing, the systems provided herein retrieve data dynamically from live sources without pre-indexing or long-term storage. Real-time results may be filtered using a blacklist or exclusion rule engine prior to alert delivery.

Systems and methods provided herein alert users to newly surfaced third-party digital listings matching predefined criteria, wherein said criteria are executed continuously or on-demand through distributed compute nodes. Systems and methods provided herein may also prevent duplicate alerts wherein each scraped listing ID is hashed and compared to a distributed ledger of previously alerted entries.

DealHunter was conceived to solve a widespread user pain point: existing resale platforms and aggregator apps either suffer from outdated cache-based listings or lack customizable real-time alerts. The platform was born from the need for a search engine that could mirror the experience of searching airline rewards (like Point.me) or housing aggregators (like Zillow), but with up-to-the-minute accuracy across decentralized, rate-limited, and inconsistent marketplaces.

Unlike traditional search engines that rely on periodic scraping or cached databases, DealHunter supports true live search—every user query triggers a federated real-time search across all integrated marketplaces. Combined with real-time alerting, DealHunter enables users to act on listings within seconds of appearance, critical in fast-moving resale markets.

The system incorporates persistent Redis-based inflight tracking and deduplicated caches to avoid redundant work and preserve data across system restarts—ensuring operational continuity and user trust.

A user-initiated live search triggers concurrent distributed search tasks across all active marketplace adapters. Each adapter resolves the query on-demand and returns fresh results, typically in under five seconds. This federated orchestration layer is designed to balance parallelism, proxy availability, and third-party rate limits, all while ensuring result freshness.

In summary, the present disclosure provides a solution to the challenges of finding and purchasing items in a fast-paced online marketplace environment. By automating the search process and delivering real-time alerts, the system offers users a significant advantage in securing desirable items. Its scalable, secure, and user-friendly design ensures that it can meet the needs of a wide range of users, from casual shoppers to serious collectors and businesses.

In an embodiment, a system that alerts users to newly surfaced third-party digital listings matching predefined criteria, wherein said criteria are executed continuously or on-demand through distributed compute nodes is provided. The system comprises a computer and an application executing on the computer that receives input for searching at least one online marketplace, the input received from a user device and providing description of a desired item of merchandise and criteria associated with the item. The system also launches web scraping of select online marketplaces in search of the item. The system also continuously monitors the select online marketplaces using Python-based headless scrapers, parses and normalizes data gathered during the web scraping with listings processed as they appear in near real time. The system also identifies items of the data matching the received input. The system also formats and pushes alerts to the user device describing the identified items.

The criteria initially comprise keywords, minimum and maximum prices, and selected online marketplaces to be searched. Older listings are included only if they were previously unavailable due to third-party marketplace behavior or latency.

Listings are not stored in a queryable cache or index, but only minimal metadata is retained solely to prevent re-alerting. Only lightweight metadata comprising at least one of listing IDs and alert status is stored, action directed to preventing duplicate notifications.

Parsing and normalizing of gathered data converts data into standardized structures thus enabling a search algorithm engine to identify the items of data matching the input. The search algorithm comprises machine learning components directed to improving accuracy of searches and predicting items of interest based on user behavior. The system simulates human browsing behavior using programmatic headless agents comprising at least one of aiohttp, httpx, and cloudscraper libraries.

In another embodiment, a system for federated live online searching is provided. The system comprises a computer and application executing thereon that receives input comprising at least one search parameter entered into a real-time query interface search bar interface. Using the input, the system also broadcasts real-time fetches to multiple online marketplaces simultaneously. The system also fetches data from results of the active scans. The system also sends an alert when the fetched data matches the at least one parameter.

The system receives the input from a client device and sends the alert to the client device via at least one of email and instant messaging. The system is integrated with proxy and rate-limiting safeguards to avoid triggering bans from source marketplaces.

The system functions as a federated search engine in a technical sense, dispatching real-time queries to third-party services without indexing or storing data locally. The system operates with distributed task processing, robust caching, fault-tolerant search retries, and proxy-based anti-bot mitigation. Listings are not stored in a queryable cache or index, but only minimal metadata is retained solely to prevent re-alerting.

In yet another embodiment, a method for gathering search results from multiple sources during real time aggregate searching and presenting the results in a unified format is provided. The method comprises a computer and application executing thereon, based on receiving a submitted query, activating a search engine to broadcast searches simultaneously across multiple online marketplaces. The method also comprises the computer and application, via the search engine, locating at least one listing in the marketplaces positively matching the query. The method also comprises the computer and application transmitting an alert describing the at least one listing to a device that submitted the query. Real-time results comprising the at least one listing are filtered using a blacklist or exclusion rule engine prior to alert delivery.

The method also comprises the computer bypassing cache layers to promote capturing the most recently available data made available by the marketplaces. The method also comprises the computer implementing proxy and rate-limiting safeguards to avoid triggering.

The method also comprises the computer preventing duplicate alerts wherein each scraped listing ID is hashed and compared to a distributed ledger of previously alerted entries. Each submitted query results in multiple live HTTP/API calls, real-time proxy usage, and dynamic parsing.

Resource and bandwidth cost of each invocation scales linearly with the number of enabled marketplaces due to lack of any precomputed search index or stored data.

What is claimed is:

1. A system that alerts users to newly surfaced third-party digital listings matching predefined criteria, wherein said criteria are executed continuously or on-demand through distributed compute nodes, comprising:

a computer; and an application executing on the computer that:

receives input for searching at least one online marketplace, the input received from a user device and providing description of a desired item of merchandise and criteria associated with the item, launches web scraping of select online marketplaces in search of the item, continuously monitors the select online marketplaces using Python-based headless scrapers, the continuous monitoring comprising background polling of the select online marketplaces, parses and normalizes data gathered during the web scraping with listings processed as they appear in near real time, identifies items of the data matching the received input, the received input being stored as user criteria against which the polled data is matched, and formats and pushes alerts to the user device describing the identified items, wherein the alerts are pushed to the user device responsive to the continuous monitoring and without query invocation by the user device, and wherein an alert is pushed for an identified item only where a listing identifier of the item, compared against stored metadata comprising listing identifiers and alert status of previously alerted listings, is determined not to have been previously alerted.

2. The system of claim 1, wherein the criteria initially comprise keywords, minimum and maximum prices, and selected online marketplaces to be searched.

3. The system of claim 1, wherein older listings are included only if they were previously unavailable due to third-party marketplace behavior or latency.

4. The system of claim 1, wherein listings are not stored in a queryable cache or index, but only minimal metadata is retained solely to prevent re-alerting.

5. The system of claim 1, wherein only lightweight metadata comprising at least one of listing IDs and alert status is stored, action directed to preventing duplicate notifications.

6. The system of claim 1, wherein parsing and normalizing of gathered data converts data into standardized structures thus enabling a search algorithm engine to identify the items of data matching the input.

7. The system of claim 6, wherein the search algorithm comprises machine learning components directed to improving accuracy of searches and predicting items of interest based on user behavior.

8. The system of claim 1, wherein the system simulates human browsing behavior, by entering search terms into and navigating pages of the select online marketplaces, using programmatic headless agents comprising at least one of aiohttp, httpx, and cloudscraper libraries.

* * * * *